United States Patent [19]

Kadomura

[11] Patent Number: 5,366,590
[45] Date of Patent: Nov. 22, 1994

[54] DRY ETCHING METHOD

[75] Inventor: Shingo Kadomura, Kanagawa, Japan

[73] Assignee: Sony Corporation, Tokyo, Japan

[21] Appl. No.: 214,122

[22] Filed: Mar. 17, 1994

[30] Foreign Application Priority Data

Mar. 19, 1993 [JP] Japan .................. 5-060755

[51] Int. Cl.$^5$ ............................. H01L 21/00
[52] U.S. Cl. .................. 156/662; 156/643; 156/646; 156/657
[58] Field of Search ........... 156/662, 643, 646, 653, 156/657

[56] References Cited

U.S. PATENT DOCUMENTS

| | | | |
|---|---|---|---|
| 4,162,185 | 7/1979 | Coburn et al. | 156/643 |
| 4,180,432 | 12/1979 | Clark | 156/643 |
| 5,286,344 | 2/1994 | Blalock et al. | 156/643 |

OTHER PUBLICATIONS

"Reactive Ion Etching of Silicon and Silicon Dioxide In $CF_4$ Plasmas Containing $H_2$ or $C_2F_4$ Additives"; J. Electrochem. Soc.; vol. 138, No. 9; Sep. 1991; Simko et al.; pp. 2748–2752.

Primary Examiner—R. Bruce Breneman
Assistant Examiner—George Goudreau
Attorney, Agent, or Firm—Hill, Steadman & Simpson

[57] ABSTRACT

Disclosed herein is a method of dry-etching $SiO_2$ layers and $Si_3N_4$ layers with high selectivity. The dry etching method employs a fluorocarbon (FC) gas represented by the formula $C_xF_y$ (where $y<x+2$) in a dry-etching system capable of generating a high-density plasma having an ion density higher than $10^{11}/cm^3$. The high-density plasma (such as ECR plasma) promotes the dissociation of gas to a great extent and hence effectively forms $CF^+$ ions even from $C_6F_6$ gas. (In the prior-art technology that employs an RF plasma, $C_6F_6$ gas merely deposits carbon polymers.) The $CF^+$ ions permits the rapid etching of the $SiO_2$ interlayer insulating film. The FC gas has such a high C/F ratio that it does not form excess $F^*$ radicals. Hence it provides high selectivity for the $Si_3N_4$ underlying film. If it is used for the etching of the $SiO_2$ layer using the $Si_3N_4$ layer as a mask, it provides high selectivity for the mask.

8 Claims, 3 Drawing Sheets

DRY ETCHING METHOD

BACKGROUND OF THE INVENTION

1. Field of the Invention

The present invention relates to a dry etching method applicable to the production of semiconductor devices, and more particularly to a method of selectively dry-etching silicon nitride layers and silicon oxide layers.

2. Description of the Related Art

A typical silicon semiconductor device has its layers insulated by a film of silicon compound, especially silicon oxide ($SiO_x$, where x is typically 2). The $SiO_x$ interlayer insulating film undergoes dry etching, which is a fully-developed technology that has been in use for mass production since the advent of 64 k DRAM.

Dry etching resorts to an etching gas composed mainly of fluorocarbon compound such as $CHF_3$, $CF_4/H_2$ mixture, $CF_4/O_2$ mixture, and $C_2F_6/CHF_3$ mixture, which offers the following advantages.

(a) The fluorocarbon compound contains carbon atoms which form on the surface of the $SiO_x$ layer, the C-O bond having a high interatomic bond energy, thereby breaking or weakening the Si-O bond.

(b) The fluorocarbon compound forms $CF_x^*$ radicals (where x is typically 3), which are the major etchant for the $SiO_2$ layer.

(c) The fluorocarbon compound provides good selectivity for the resist mask and the underlying layer, with a minimum deposition of a carbon polymer, if the C/F ratio in the etching reaction system is properly controlled. (The underlying layer denotes silicon layers such as silicon substrate, polysilicon layer, and polyside film.)

The silicon semiconductor device also has its layers insulated by a film of silicon nitride ($Si_xN_y$, where especially x=3 and y=4). The $Si_xN_y$ layer also undergoes dry etching using an etchant which has basically the same composition as that used for the $SiO_x$ layer. While the etching of $SiO_x$ layers resorts to the ion-assisted reaction, the etching of $Si_xN_y$ layers resorts to the radical reaction in which $F^*$ radicals play an important role. In addition, the latter is faster than the former. This can be expected based on the varying interatomic bond energies given below.

553 kcal/mol for the Si—F bond
465 kcal/mol for the Si—O bond
440 kcal/mol for the Si—N bond (taken from "Handbook of Chemistry and Physics", 69th ed. (1988), edited by R. C. Weast, published by CRC Press, Florida, U.S.)

The production of silicon semiconductor devices involves several steps for the highly-selective etching of $SiO_x$ layers and $Si_xN_y$ layers. For example, the $Si_xN_y$ layer on the $SiO_x$ layer undergoes etching for the patterning to define the element separating regions by the LOCOS (local oxidation of silicon) method. This etching needs to have an especially high selectivity under the condition that the pad oxide film ($SiO_2$ layer) is made to be thin to minimize the bird's beak length.

On the other hand, as a result of recent devices becoming smaller and more complex than before, there has occurred an instance where it is necessary to carry out selective etching for the $SiO_x$ layer on the $Si_xN_y$ layer as an etching stop layer to prevent etching damage. For example, recent devices have a thin $Si_xN_y$ layer formed on the substrate surface to relieve the substrate from etching damage in the case of over-etching. They also have a gate insulating film of ONO structure ($SiO_x$ layer / $Si_xN_y$ layer / $SiO_x$ layer), or they have an $Si_xN_y$ layer laminated on the surface of the gate electrode. In these cases, it is necessary that the etching of the $SiO_x$ layer stop with certainty when it reaches the surface of the $Si_xN_y$ layer.

For the highly-selective etching to be applied to layers formed on top of the other, it is desirable that they differ in the interatomic bond energy to some extent. Unfortunately, the $SiO_x$ layer and $Si_xN_y$ layer have an Si—O bond and Si—N bond, respectively, whose interatomic bond energies are close to each other. Therefore, it is basically difficult to perform highly-selective etching on them.

Attempts have been made to establish a technique for such selective etching. There are some reports on the method of etching an $Si_xN_y$ layer on an $SiO_x$ layer. In fact, the present inventors have disclosed in Japanese Patent Laid-open No. 142744/1986 a technique which employs as an etching gas a mixture composed of a fluorocarbon gas (such as $CH_2F_2$ having a low C/F atomic ratio) and 30–70 mol% of $CO_2$. A fluorocarbon gas of low C/F ratio forms $CF_x.^+$ (especially x=3) as an etchant for the $SiO_x$ only through recombination of $F^*$. If this system is supplied with a large amount of $CO^*$ which captures $F^*$ and removes it in the form of COF, the formation of $CF_x^+$ decreases and hence the etching rate for the $SiO_2$ layer decreases. On the other hand, since the $Si_xN_y$ layer undergoes etching by $F^*$, the etching rate for the $Si_xN_y$ layer remains almost unchanged even though the amount of $CF_x^+$ decreases due to the addition of copious amounts of $CO_2$. The consequence is the selectivity for the two layers.

Another etching technique is reported in "Proceedings of Symposium on Dry Process", vol. 88, No. 7, pp. 86–94 (1987). This technique is characterized by feeding a chemical dry-etching apparatus with $NF_3$ and $Cl_2$ and carrying out etching for the $Si_xN_y$ layer on the $SiO_x$ layer by utilizing FCl which is formed in the gas phase by microwave discharge. The fact that 55% of the Si—O bond energy is ionic whereas 30% of the Si—N bond energy is ionic suggests that the chemical bond in the $Si_xN_y$ layer is similar to the chemical bond (covalent bond) in single-crystal silicon. Therefore, the $Si_xN_y$ layer is subject to etching by $F^*$ and $Cl^*$ radicals dissociated from FCl, whereas the $SiO_x$ layer is immune to etching by these radicals. This is the reason for the high selectivity.

As mentioned above, there are reports on several techniques of selective etching of the $Si_xN_y$ layer on the $SiO_x$ layer. These techniques are a natural consequence of the fact that etching of the $Si_xN_y$ layer by radical reaction is necessarily decelerated as it reaches the $SiO_x$ layer. A disadvantage of these conventional techniques is that the process employing FCl (or the radical reaction) involves inherent difficulties with anisotropic etching.

By contrast, only a few techniques have been disclosed on selective etching of the $SiO_x$ layer on the $Si_xN_y$ layer because it is more difficult to establish a desired selectivity than in the case where the two layers are reversed. The reason for this is that etching of the $SiO_x$ layer by an ion-assisted reaction inevitably forms radicals in the reaction system and these radicals accelerate the etching rate when the underlying layer (or the $Si_xN_y$ layer) is exposed.

Recent technical advancement has, however, achieved this object, namely by use of a new plasma source which generates a high-density plasma with a smaller amount of radicals. An example is reported in Proceedings of the 43rd Symposium on Semiconductors and Integrated Circuits Technology, p. 54 (1992). According to this report, etching is carried out by means of induction coupled plasma (ICP) of $C_2F_6$ (hexafluoroethane) gas for the $SiO_x$ layer (formed by the TEOS-CVD process) on the $Si_3N_4$ layer (formed by LP-CVD process), so as to make a connecting hole which partly overlaps with the gate electrode. Etching in the reported technique occurs presumably due to $CF^+$ formed from $C_2F_6$ by dissociation in the high-density plasma. The high selectivity stems from the fact that etching deposits a fluorocarbon polymer of a low C/F ratio and the carbon atoms in the polymer combine more readily with the oxygen atoms in $SiO_x$ than with the nitrogen atoms in $Si_xN_y$, with the result that they are removed from the surface of the $SiO_x$ layer but they accumulate on the surface of the $Si_xN_y$ layer.

The foregoing technique seems to be promising but has the disadvantage that it lacks a stable selectivity. For example, it is reported that the selectivity is infinite for the flat part but is 20 or above for the corner part. Presumably, the fluctuation in the selectivity is due to $F^*$ radicals, resulting from an extremely dissociated $C_2F_6$.

SUMMARY OF THE INVENTION

The present invention was completed in view of the forgoing. Accordingly, it is an object of the present invention to provide a dry-etching method that can be applied to the $SiO_x$ layer with a stable, high selectivity for the $Si_xN_y$ layer.

The present invention is embodied in a dry-etching method which comprises performing etching on an $SiO_x$ layer formed on an $Si_xN_y$ layer with a plasma of etching gas composed mainly of a fluorocarbon compound represented by the formula of $C_xF_y$ (where $y \leq x+2$, x and y being natural numbers), said plasma being generated in an etching apparatus capable of generating a plasma having an ion density higher than $10^{11}/cm^3$.

BRIEF DESCRIPTION OF THE DRAWINGS

FIG. 1(a) shows the step in which a resist mask is formed on an interlayer insulating film of $SiO_2$. FIG. 1(b) shows the step in which etching of the interlayer insulating film of $SiO_2$ ceases as it reaches the underlying layer of $Si_xN_y$. FIG. 1(c) shows the step in which the resist mask is removed by ashing. FIG. 1(d) shows the step in which the underlying film of $Si_3N_4$ in the contact hole is selectively removed.

FIG. 2(a) shows the step in which an interlayer insulating film of $SiO_2$ is formed (which covers two gate electrodes having thereon an etch stop layer of $Si_xN_y$) and a resist mask is formed. FIG. 2(b) shows the step in which side walls are formed and a contact hole is formed.

DETAILED DESCRIPTION OF THE INVENTION

Figure 1A:
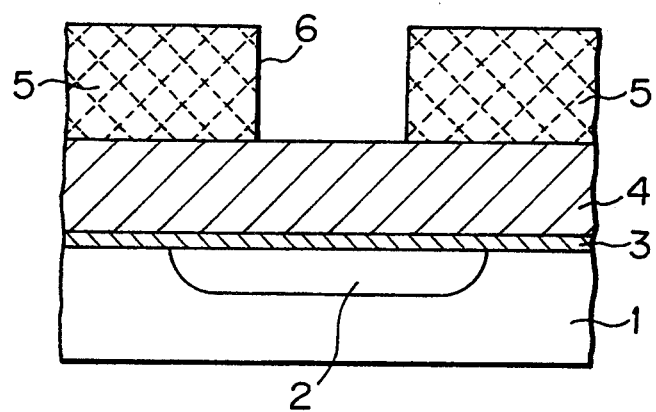
FIGS. 1(a)-1(d) is a series of schematic sectional views showing how a contact hole is made by the sequential steps of the method of the present invention.

By the term, "high-density plasma" as it is used in the present invention is meant a plasma in which collisions between electrons and gaseous atoms take place more frequently than in a plasma of the conventional type which is induced by glow discharge which occurs upon application of RF power across two parallel flat electrodes or by microwave discharge resulting from microwave supplied through a waveguide. By contrast, the high-density plasma is generated by electron cyclotron resonance which is based on the mutual action of the microwave and the magnetic field, or by the microwave propagation mode in the magnetic field (which is referred to as the whistler mode). The high-density plasma has a high ion density owing to a high degree of dissociation of the gas.

Examples of the plasma having an ion density higher than $10^{11}/cm^3$ include ECR plasma, helicon wave plasma, inductively coupled plasma (ICP), transformer coupled plasma (TCP), hollow anode type plasma, and helical resonator plasma.

The above-mentioned fluorocarbon compound is an unsaturated compound as its general formula suggests. It may have a linear or cyclic carbon skeleton. With a large number of carbon atoms, a compound of linear structure necessarily has successive multiple bonds or conjugated multiple bonds, and a compound of cyclic structure has conjugated multiple bonds or takes on the condensed ring structure, polycyclic structure, spiral structure, or ring assembly structure.

Examples of the fluorocarbon compound that meets the requirements include tetrafluoroethylene ($C_2F_4$), hexafluorobutadiene ($C_4F_6$), tetrafluorocyclopropene (c-$C_3F_4$), hexafluorocyclobutene (c-$C_4F_6$), hexafluorobenzene ($C_6F_6$), octafluorocycloheptatriene (c-$C_7F_8$), and octafluorobicyclo[2.2.1]heptadiene ($C_7C_8$).

According to the present invention, a plasma of etching gas composed mainly of fluorocarbon compound represented by the formula of $C_xF_y$ (where $y \leq x+2$, x and y are natural numbers) is generated in an etching apparatus capable of generating a plasma having an ion density higher than $10^{11}/cm^3$, and etching is performed on an $SiO_x$ layer using a patterned $Si_xN_y$ layer as a mask.

In a preferred embodiment of the present invention, the above-mentioned fluorocarbon compound is hexafluorobenzene.

The etching gas of fluorocarbon compound, which is in the form of high-density plasma having an ion density higher than $10^{11}/cm^3$, contains a large amount of $F_x^+$ ions (where x is 1 in most cases) because of dissociation which takes place more readily than in the case of conventional RF plasma even under a low pressure. These ions take part in the etching of the silicon compound layer at a practical etching rate.

The formation of $CF_x^+$ ions might be accompanied by the formation of $F^*$ radicals. In such a case, the selectivity for the $Si_xN_y$ layer becomes poor. To avoid this, it is necessary to use a fluorocarbon compound having a high C/F ratio (in which there are less fluorine atoms relative to carbon atoms). The fluorocarbon compound used in the present invention contains more carbon atoms than fluorine atoms by 2 at the most. Therefore, it may be assumed that, in the simplest case, one fluorocarbon molecule will form 2 F* radicals at the most when it forms x CF+ ions.

Since the present invention employs such a fluorocarbon compound for the etching of the $SiO_x$ layer on the $Si_xN_y$ layer, there is no possibility that the $Si_xN_y$ layer is exposed to F* radicals in high concentration. This is the reason why a high selectivity is achieved for the underlying $Si_xN_y$ layer.

This principle holds true also in the case where a patterned $Si_xN_y$ layer is used as an etching mask for an underlying $SiO_x$ layer. In this case, too, a high mask selectivity is attained.

In the present invention, it is recommended that hexafluorobenzene ($C_6F_6$) be used as the above-mentioned fluorocarbon compound because of its stability, availability, and high C/F ratio (which is 1). Attempts to use $C_6F_6$ for the etching of the $SiO_x$ layer have not been successful because, when used alone, it gives rise to a large amount of $CF_3^+$ and $CF_2^+$ ions which in turn form a polymer to interfere with etching, as described in Japanese Patent Publication No. 60938/1989. According to the disclosure, this problem is solved by mixing $C_6F_6$ with an equal amount of $CF_4$ to inhibit the formation of carbon polymer.

In the present invention, there is no possibility of carbon polymer excessively accumulating, because $C_6F_6$ is dissociated into CF+ ions in the high-density plasma. Even in the case where each atom gives rise to 6 CF+ ions through the cleavage of all of the carbon-carbon bonds, theoretically none of F* radicals is formed. This leads to a high selectivity for the $Si_xN_y$ layer. The fact that highly selective etching can be achieved with a single gas in the present invention is advantageous from the standpoint of stability and controllability.

The invention will be described in more detail with reference to the following examples.

EXAMPLE 1

This example demonstrates how a contact hole is made by etching an $SiO_2$ interlayer insulating film, with an $Si_3N_4$ film underlying, using $C_6F_6$ gas and a magnetically enhanced microwave plasma etching system.

On a silicon substrate (1), with an impurity diffusion region (2) therein, formed were a 10-nm thick $Si_3N_4$ underlying film (3) by LP-CVD and subsequently a 1000-nm thick $SiO_2$ interlayer insulating film (4) by atmospheric CVD. The latter film was coated with a positive-type novolak photoresist ("TSMR-V3" from Tokyo Ouka Kogyo Co., Ltd.), which subsequently underwent ion-beam lithography and alkali development to be made into a resist mask (5) having an opening (6) of 0.35 μm in diameter. (FIG. 1(a))

The wafer was placed on the wafer holder electrode in the magnetically-enhanced microwave plasma etching system. Etching was performed on the $SiO_2$ interlayer insulating film (4) under the following conditions.

| | |
|---|---|
| $C_6F_6$ gas flow rate | 20 SCCM |
| Gas pressure | 0.65 Pa |
| Microwave power | 1500 W (2.45 GHz) |
| RF bias power | 200 W (800 kHz) |
| Temperature of wafer holding electrode | 20° C. |

The great microwave power is for ECR discharge which promotes the dissociation of $C_6F_6$ and hence produces a high-density plasma having a high ion density in the order of $10^{11}/cm^3$. The etching of the $SiO_2$ interlayer insulating film (4) proceeded rapidly owing to CF+ ions produced in large quantities in the high-density plasma. The selectivity for the $Si_3N_4$ underlying film (3) was as high as about 30, because there no excess F* radicals existed in the plasma when it was exposed. The selectivity for the resist mask (5) was also good.

Figure 1B:
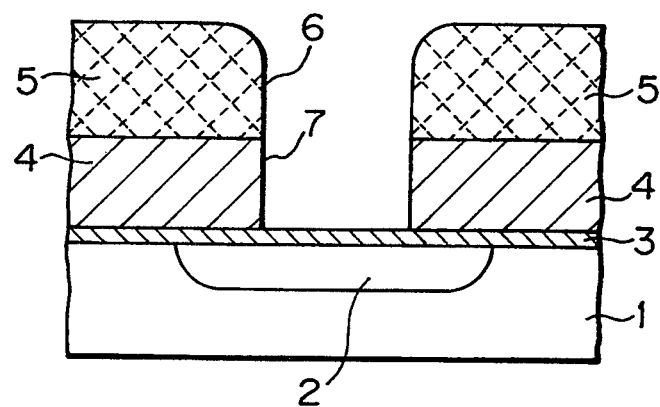

As a result of etching, a contact hole (7) having an anisotropic shape was obtained, as shown in FIG. 1(b). The $Si_3N_4$ underlying film (3) exposed at the bottom of the contact hole remained intact.

The etching caused a slight deposition of carbon polymer (not shown). This carbon polymer contributed to the protection of the resist mask (5), the side wall of the contact hole (7), and the exposed surface of the $Si_3N_4$ underlying film (3). In the etching region of the $SiO_2$ interlayer insulating film (4), the carbon polymer was eventually removed by combustion by oxygen atoms sputtered out of that region. The deposition of the carbon polymer was not so heavy as to interfere with etching, unlike that encountered in the conventional method.

Figure 1C:
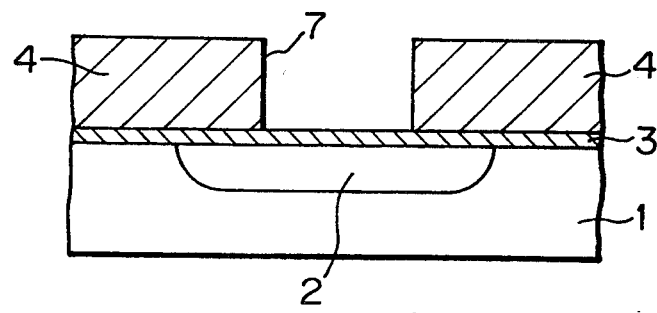

The wafer was transferred to a plasma ashing apparatus, in which ashing with oxygen was carried out in the usual way to remove the resist mask (5), as shown in FIG. 1(c). During ashing, the carbon polymer (not shown), which contributed to the protection of surfaces and side walls, was also removed.

Figure 1D:
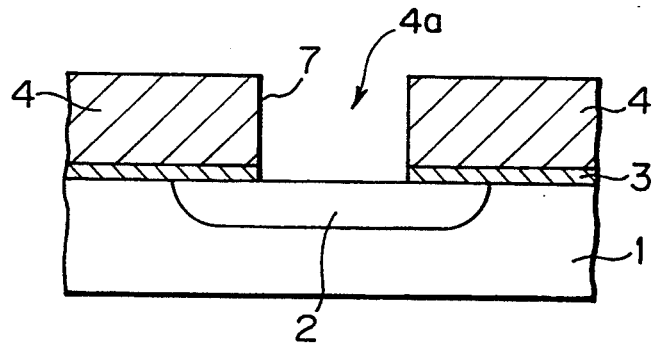

Finally, the wafer was dipped in a hot aqueous solution of phosphoric acid to decompose and remove the $Si_3N_4$ underlying film (3) exposed at the bottom of the contact hole (4a), as shown in FIG. 1(d).

Thus, the contact hole (7) having a good anisotropic shape was formed without the possibility of causing particle contamination and damage to the impurity diffusion region (2).

EXAMPLE 2

This example demonstrates how etching is performed on an $SiO_2$ interlayer insulating film using $C_6F_6$ gas and an ICP etching system to make connection by the self-alignment technique between the gate electrode and the memory node of a TFT as load for SRAM. The process will be explained with reference to FIG. 2.

Figure 2A:
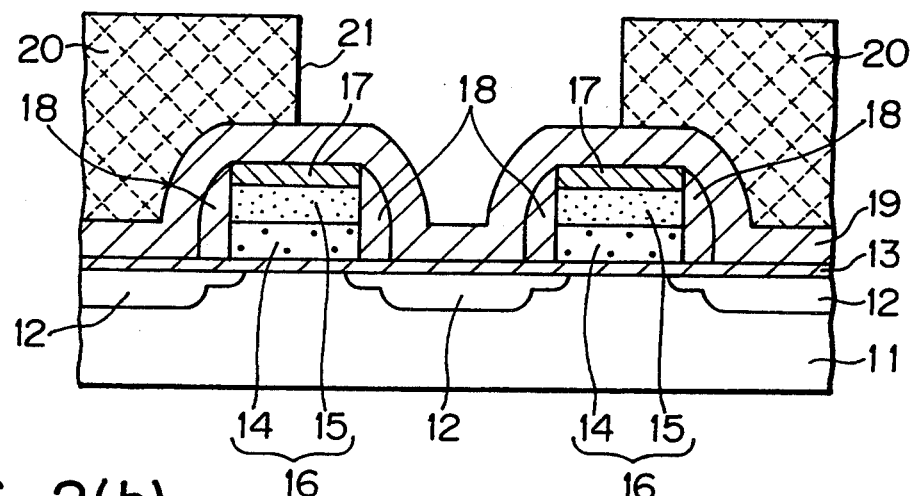
FIGS. 2(a)-2(b) is a series of schematic sectional views showing how a self-aligned contact for SRAM is made by the sequential steps of the method of the present invention.

The wafer used for etching is constructed as shown in FIG. 2(a). It is composed of a silicon substrate (11) and a gate oxide film (13) formed thereon by surface oxidation. It has two gate electrodes (16) of a driver transistor, with an $Si_3N_4$ etching stop layer (17) patterned thereon so as to protect them from the subsequent etching. The gate electrode (16) is a polyside film composed of a polysilicon layer (14) and a tungsten silicide ($WSi_x$) layer (15) formed on top of the other. On both sides of the gate electrode (16) are $SiO_2$ side walls (18) which were formed by the etching back process. In the silicon substrate (11) is an impurity diffusion region (12) of the LDD structure which was formed by performing ion implantation twice using the gate electrode (16) and side wall (18) as the mask.

The wafer is entirely covered with an $SiO_2$ interlayer insulating film (19) formed by the CVD process. On the $SiO_2$ interlayer insulating film (19) is patterned a resist mask (20). The resist mask (20) partly covers each of the electrodes (16) and has an opening (21) between the electrodes (16). Etching on the $SiO_2$ interlayer insulating film (19) is performed in this opening (21) to make a contact hole reaching the impurity diffusion region.

The wafer was placed in an ICP etching system, and etching was performed on the $SiO_2$ interlayer insulating film (19) under the following conditions.

| $C_6F_6$ gas flow rate | 20 SCCM |
|---|---|
| Gas pressure | 0.65 Pa |
| RF source power | 2500 W (2 kHz) |
| RF bias power | 50 W (1.8 MHz) |
| Temperature of wafer holding electrode | 0° C. |

Figure 2B:
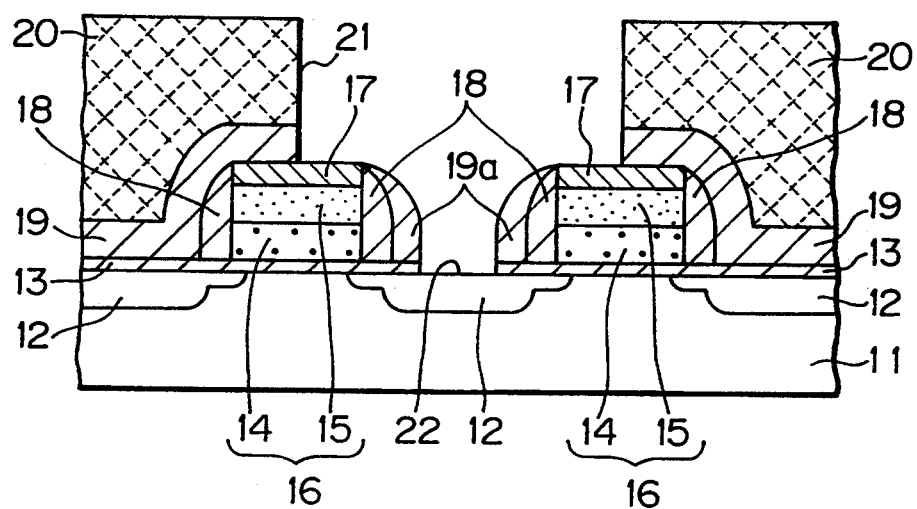
Figure 3:
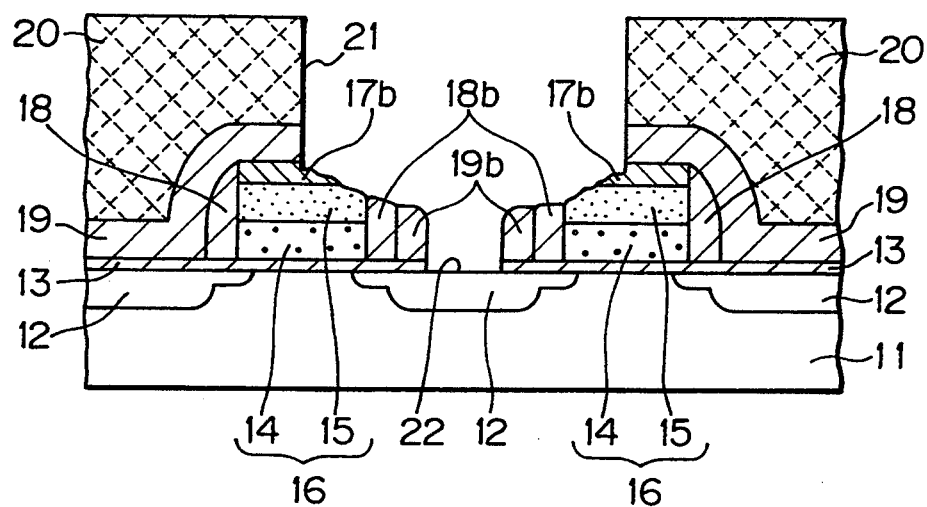
FIG. 3 is a schematic sectional view showing a contact hole for SRAM formed by the self-alignment technique in Comparative Example. It is to be noted that the gate electrode and the side wall are attacked owing to the low selectivity for the $Si_xN_y$ etch stop layer.

In this process, etching on the $SiO_2$ interlayer insulating film (19) was by $CF^+$ ions contained in the high-density plasma (having an ion density of the order of $10^{12}/cm^3$) produced by the ICP etching system. Thus, a contact hole (22) was formed, with the $SiO_2$ interlayer insulating film (19) and the $SiO_2$ gate film (13) partly removed and the side wall (18) covered with another side wall (19a), as shown in FIG. 2(b).

In the course of etching, the $Si_3N_4$ etching stop layer (17) was exposed; however, it was left unetched owing to the high selectivity resulting from the fact that the plasma contains only a small amount of $F^*$ radicals because of the high dissociation of $C_6F_6$ (as in the case of Example 1). Thus, it was possible to perform etching on the greatly stepped $SiO_2$ interlayer insulating film (19) without causing damage to the gate electrode (16).

Comparative Example

This comparative example demonstrates how etching is performed to make a contact hole for SRAM by the self-alignment technique using $C_2F_6$ gas and an ICP etching system as in Example 2.

The same wafer as shown in FIG. 2(a) was set in the ICP etching system. Etching on the $SiO_2$ interlayer insulating film (19) was performed under the following conditions.

| $C_2F_6$ gas flow rate | 20 SCCM |
|---|---|
| Gas pressure | 0.65 Pa |
| RF source power | 2500 W (2 kHz) |
| RF bias power | 50 W (1.8 MHz) |
| Temperature of wafer holding electrode | 0° C. |

In this process, not only $CF^+$ ions but also a large amount of $F^*$ radicals were formed by the high dissociation of $C_2F_6$. The $F^*$ radicals reduced the selectivity for the $Si_3N_4$ etch stop layer (17) which had been exposed during etching As a result, the $Si_3N_4$ etch stop layer (17b) and the gate electrode (16) thereunder were partly attacked and the side walls (18b, 19b) took on a poor shape.

Although the invention has been described with reference to the foregoing two examples, it is to be understood that the invention is not limited to the specific embodiments thereof. For example, the ECR plasma and ICP used as a high-density plasma in Examples may be replaced by a hollow anode-type plasma (having an ion density of $10^{12}/cm^3$) or a helicon wave plasma (having an ion density of $10^{12}-10^{13}/cm^3$). In addition, the fluorocarbon compound $C_xF_y$ as an etching gas is not limited to $C_6F_6$. It is possible to use any compound so long as it meets the requirement ($y \leq x+2$) and is stable and capable of being readily introduced in the form of gas into the etching chamber.

The dry-etching method of the present invention may also be applied to the etch back of the $SiO_2$ interlayer insulating film on the three-layered gate insulating film of the ONO structure ($SiO_x/Si_xN_y/SiO_x$). The etch back to form side walls on the gate electrode stops as it reaches the $Si_xN_y$ film in the middle of the gate insulating film, owing to the high selectivity. It is possible, of course, to modify the etching conditions and etching system as required.

The foregoing demonstrates that the dry-etching method of the present invention can employ as an etching gas a fluorocarbon compound having a high C/F ratio by highly dissociating it in a high-density plasma. (Such a fluorocarbon compound has never been used because it forms a large amount of carbon polymer.) In addition, the fluorocarbon compound provides high selectivity for the $SiO_x$ layer and the $Si_xN_y$ layer because it does not form excess $F^*$ radicals when it undergoes dissociation by discharge. Therefore, the present invention will be suitably applied to the production of sophisticated, highly-integrated, high-performance semiconductor devices, and hence it is of great industrial value.

What is claimed is:

1. A dry-etching method which comprises performing etching on a silicon oxide layer formed on a silicon nitride layer with a plasma of etching gas composed mainly of a fluorocarbon compound represented by the formula of $C_xF_y$ (where $y \leq x+2$, x and y being natural numbers), said plasma being generated in an etching apparatus capable of generating a plasma having an ion density higher than $10^{11}/cm^3$.

2. A dry-etching method as defined in claim 1, wherein the silicon oxide layer has a patterned masking layer formed thereon.

3. A dry-etching method as defined in claim 1, which further comprises a step of removing the silicon nitride layer after it has been exposed.

4. A dry-etching method as defined in claim 1, wherein the silicon oxide layer is composed of $SiO_2$.

5. A dry-etching method as defined in claim 1, wherein the silicon nitride layer is composed of $Si_3N_4$.

6. A dry-etching method which comprises covering a silicon oxide layer with a silicon nitride layer which is patterned such that the area to be etched on the silicon oxide layer is exposed, and performing etching, using the silicon nitride layer as a mask, on the silicon oxide layer with a plasma of etching gas composed mainly of a fluorocarbon compound represented by the formula of $C_xF_y$ (where $y \leq x+2$, x and y being natural numbers), said plasma being generated in an etching apparatus capable of generating a plasma having an ion density higher than $10^{11}/cm^3$.

7. A dry-etching method as defined in claim 1, wherein the fluorocarbon compound is hexafluorobenzene.

8. A dry-etching method as defined in claim 6, wherein the fluorocarbon compound is hexafluorobenzene.

* * * * *